United States Patent
Wu et al.

(10) Patent No.: US 8,901,627 B2
(45) Date of Patent: Dec. 2, 2014

(54) JOG DESIGN IN INTEGRATED CIRCUITS

(71) Applicant: Taiwan Semiconductor Manufacturing Company, Ltd., Hsin-Chu (TW)

(72) Inventors: Tsung-Lin Wu, Taichung (TW); Tung-Heng Hsieh, Zhudong Town (TW); Jiun-Ming Kuo, Taipei (TW); Min-Hsiung Chiang, New Taipei (TW); Che-Yuan Che, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 85 days.

(21) Appl. No.: 13/679,238

(22) Filed: Nov. 16, 2012

(65) Prior Publication Data
US 2014/0138750 A1 May 22, 2014

(51) Int. Cl.
*H01L 29/76* (2006.01)
*H01L 29/78* (2006.01)
*H01L 29/66* (2006.01)

(52) U.S. Cl.
CPC .......... *H01L 29/78* (2013.01); *H01L 29/66477* (2013.01)

USPC .......................................................... 257/288

(58) Field of Classification Search
USPC ................. 257/901, 213–413, 900, 902, 903; 438/292–308
See application file for complete search history.

(56) References Cited

U.S. PATENT DOCUMENTS

| | | | | |
|---|---|---|---|---|
| 2011/0042752 | A1 * | 2/2011 | Mayuzumi | 257/369 |
| 2011/0248321 | A1 * | 10/2011 | Guo et al. | 257/288 |
| 2013/0307032 | A1 * | 11/2013 | Kamineni et al. | 257/288 |

* cited by examiner

*Primary Examiner* — Dao H Nguyen
*Assistant Examiner* — Tram H Nguyen
(74) *Attorney, Agent, or Firm* — Slater & Matsil, L.L.P.

(57) ABSTRACT

A device includes an active region in a semiconductor substrate, a gate strip over and crossing the active region, and a jog over the active region and connected to the gate strip to form a continuous region. The jog is on a side of the gate strip. A first contact plug is at a same level as the gate strip, wherein the first contact plug is on the side of the gate strip. A second contact plug is over the jog and the first contact plug. The second contact plug electrically interconnects the first contact plug and the jog.

19 Claims, 12 Drawing Sheets

US 8,901,627 B2

JOG DESIGN IN INTEGRATED CIRCUITS

BACKGROUND

To electrically short an active region of a Metal-Oxide-Semiconductor (MOS) device to a gate electrode strip, a butted contact plug may be formed to interconnect the active region and the gate electrode strip. Conventionally, the active region and the gate electrode strip were connected to electrical ground for device isolation purpose.

In the conventional structures, the gate electrode strip that was used for the device isolation was formed over a Shallow Trench Isolation (STI) region. The STI region requires more chip area than the gate electrode strip. This causes the adverse reduction in the device density.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Metal-Oxide-Semiconductor (MOS) devices and isolation structures and the method of forming the same are provided in accordance with various exemplary embodiments. The intermediate stages of forming the MOS devices and the isolation structures are illustrated. The variations of the embodiments are discussed. Throughout the various views and illustrative embodiments, like reference numbers are used to designate like elements.

Figure 1A:
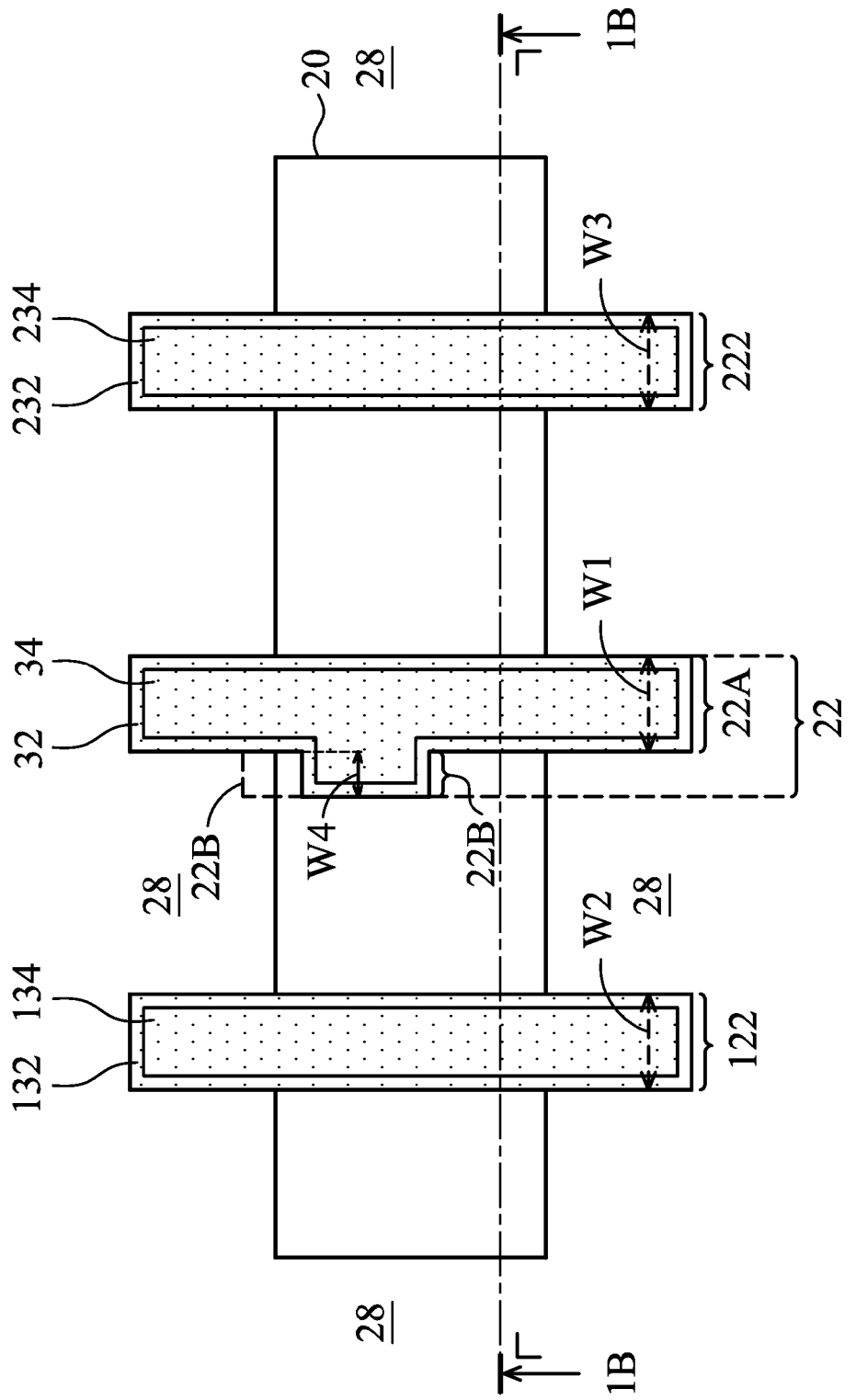
FIGS. 1A through 6 are top views and cross-sectional views of intermediate stages in the manufacturing of Metal-Oxide-Semiconductor (MOS) devices and a device isolation structure in accordance with some exemplary embodiments.

FIG. 1A illustrates gate strips 22, 122 and 222 formed over active region 20. In some embodiments, active region 20 is a continuous active region, which is formed of a semiconductor material. Active region 20 is defined by, for example, encircled by, isolation regions 28. Gate strips 22, 122 and 222 have longitudinal directions parallel to each other. Each of gate strips 22, 122 and 222 may include a portion overlapping active region 20, and portions overlapping isolation regions 28, which may be, for example, Shallow Trench Isolation (STI) regions.

Gate strips 122 and 222 may have uniform widths W2 and W3, respectively. Gate strip 22 may include strip portion 22A and jog 22B connected to strip portion 22A. Strip portion 22A may have width W1 equal to widths W2 and W3. Furthermore, strip portion 22A and gate strips 122 and 222 may be equally spaced, although the spacings therebetween may also be different. Jog 22B and strip portion 22A are continuously connected, with no interface formed therebetween. Jog 22B has width W4, wherein ratio W4/W1 may be greater than about 0.13, and may be between about 0.13 and about 0.55. In some exemplary embodiments, width W4 is between about 2.5 nm and about 10 nm, and widths W1, W2, and W3 may be between about 18 nm and about 20 nm. It is appreciated, however, that the values recited throughout the description are merely examples, and may be changed to different values. An entirety of jog 22B may be aligned to, and overlap, active region 20, although a portion of jog 22B may extend to overlap STI region 28, wherein dashed lines indicate the respective edges of jog 22B.

Gate strip 22 includes gate dielectric 32 and gate electrode 34. Gate strip 122 includes gate dielectric 132 and gate electrode 134. Gate strip 222 includes gate dielectric 232 and gate electrode 234. In some embodiments, gate strips 22, 122, and 222 are replacement gates that are formed using a gate-last approach. Accordingly, gate dielectric 32 comprises a bottom portion (FIG. 1B) overlapped by gate electrode 34, and sidewall portions on the sidewalls of gate electrode 34. Similarly, gate dielectric 132 comprises a bottom portion (FIG. 1B) overlapped by gate electrode 134, and sidewall portions on the sidewalls of gate electrode 134, and gate dielectric 232 comprises a bottom portion overlapped by gate electrode 234, and sidewall portions on the sidewalls of gate electrode 234. In Alternative embodiments, gate strips 22, 122, and 222 are formed using a gate-first approach. Accordingly, gate dielectrics 32, 132, and 232 do not comprise portions of sidewalls of the respective gate electrode 34, 134, and 234. Entireties of gate electrodes 34, 134, and 234 are formed of a same material, and are formed simultaneously. Entireties of gate dielectrics 32, 132, and 232 are formed of a same material, and are formed simultaneously.

Figure 1B:
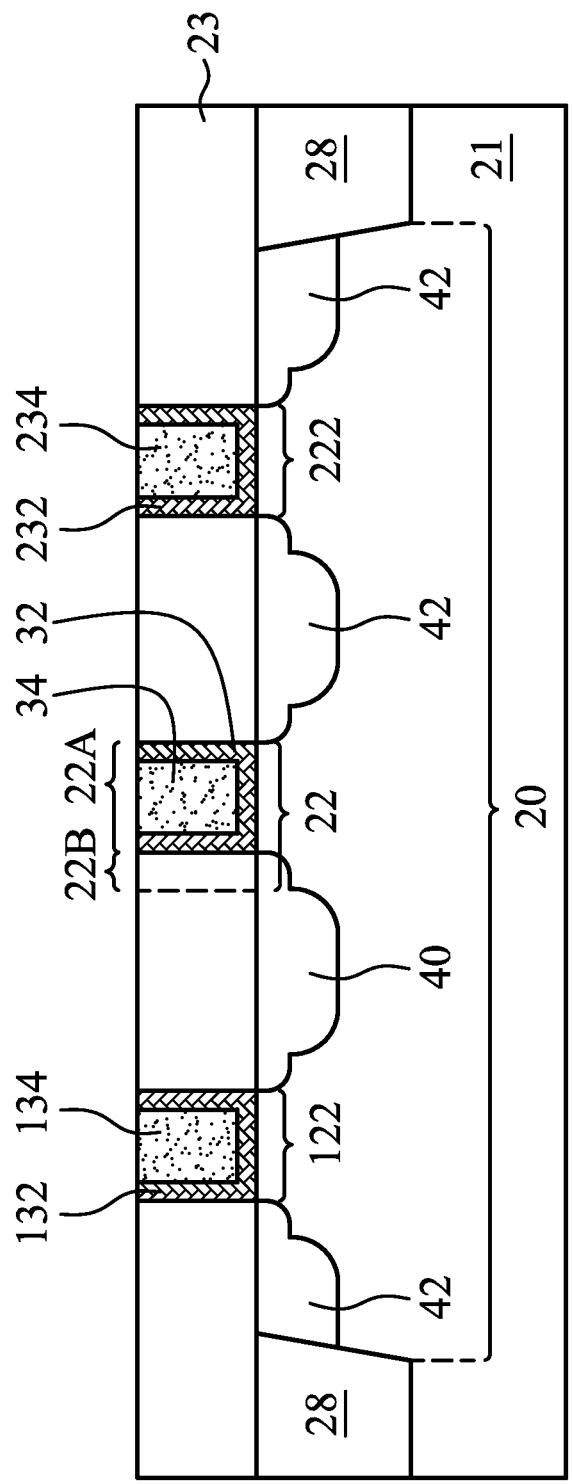

FIG. 1B illustrates a cross-sectional view of the structure in FIG. 1A, wherein the cross-sectional view is obtained from the plane crossing line 1B-1B in FIG. 1A. As shown in FIG. 1B, gate strips 22, 122, and 222 are formed over active region 20, which is a part of substrate 21. In some embodiments, substrate 21 is a semiconductor substrate, and may be a silicon substrate, a silicon germanium substrate, a III-V compound semiconductor substrate, etc. Since jog 22B is not in the illustrated plane, an edge of jog 22B is illustrated using a dashed line. Source and drain regions 40 and 42 are formed in active region 20. Source and drain regions 40 and 42 are referred to as source/drain regions 40 and 42 throughout the description to indicate that each of them may be a source region or a drain region. Gate strips 22, 122, and 222 are formed in Inter-Layer Dielectric (ILD, referred to as ILD0 hereinafter) 23, wherein ILD 23 may be formed of an oxide such as Phospho-Silicate Glass (PSG), Boro-Silicate Glass (BSG), Boron-Doped Phospho-Silicate Glass (BPSG), tetraethyl orthosilicate (TEOS), or the like. The formation of gate strips 22, 122, and 222 may include forming dummy gate electrodes (such as dummy polysilicon strips, not shown) over active region 20 and STI 28, forming ILD 23, removing the dummy gate electrodes to form openings in ILD 23, filling a gate dielectric layer and a conductive material in ILD 23, and performing a Chemical Mechanical Polish (CMP) to remove excess portions of the conductive material and the gate dielectric layer over ILD 23.

Figure 2A:
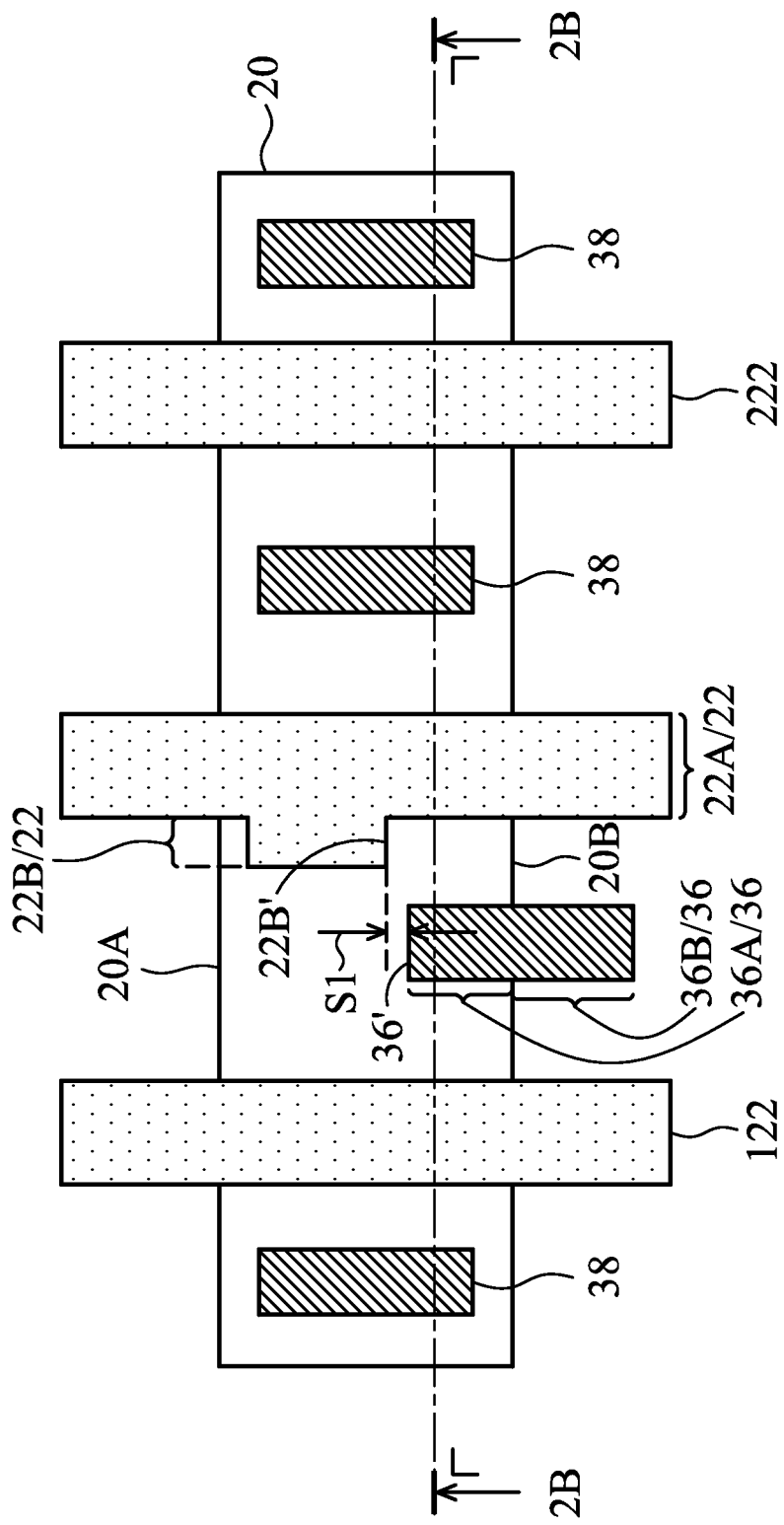

FIG. 2A illustrates the formation of contact plugs (sometimes referred to as M0_OD1) 36 and 38. M0_OD1 36 comprises portion 36A overlapping active region 20. In some embodiments, M0_OD1 36 further comprises portion 36B overlapping a portion of STI region 28. In alternative embodiments, portion 36B is not formed, and an entirety of M0_OD1 36 overlaps active region 20. In some embodiments, M0_OD1 36 is misaligned from jog 22B. For example, edge 36' of M0_OD1 36 and the extension line of edge 22B' of jog 22B are spaced apart from each other by distance S1, which is equal to or greater than 0 nm, and may be greater than about 2 nm. Furthermore, in the top view as in FIG. 2A, M0_OD1 36 is closer to edge 20B of active region 20 than an entirety of jog 22B, and jog 22B is closer to edge 20A of active region 20 than the portion of M0_OD1 36 overlapping active region 20. M0_OD1s 38 may have entireties overlapping active region 20. Accordingly, M0_OD1 36 may also be misaligned to M0_OD1s 38.

Figure 2B:
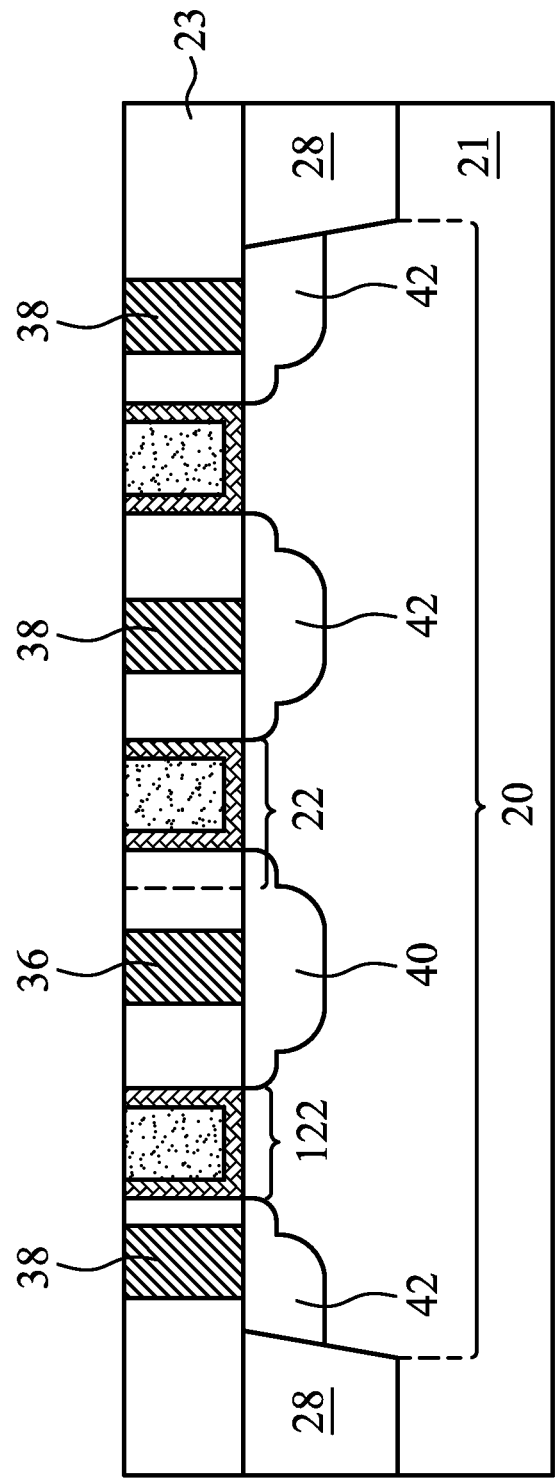

FIG. 2B illustrates a cross-sectional view of the structure in FIG. 2A, wherein the cross-sectional view is obtained from the plane crossing line 2B-2B in FIG. 2A. M0_OD1 36 is over, and electrically coupled to, source/drain region 40, which is the common source/drain region shared by gate strips 22 and 122. A silicide region (not shown) may be formed between, and in contact with, M0_OD1 36 and the underlying source/drain region 40. M0_OD1s 38 are over, and electrically coupled to, the respective underlying source/drain regions 42. Silicide regions (not shown) may be formed between, and in contact with, M0_OD1 38 and the underlying source/drain region 42. M0_OD1s 36 and 38 are formed in ILD 23 by forming openings in ILD 23, and filling a conductive material in ILD 23, followed by a CMP.

Figure 4A:
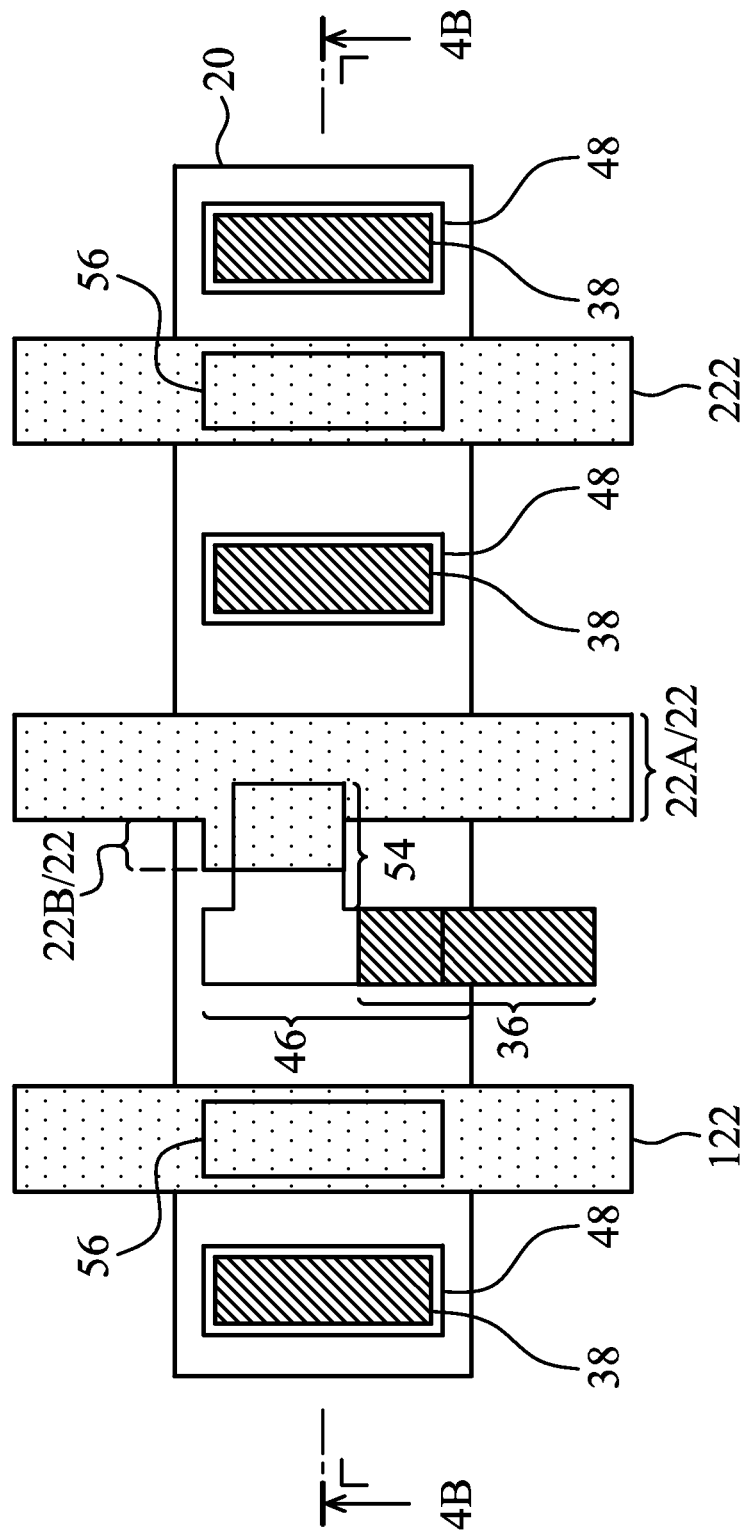
Figure 4B:
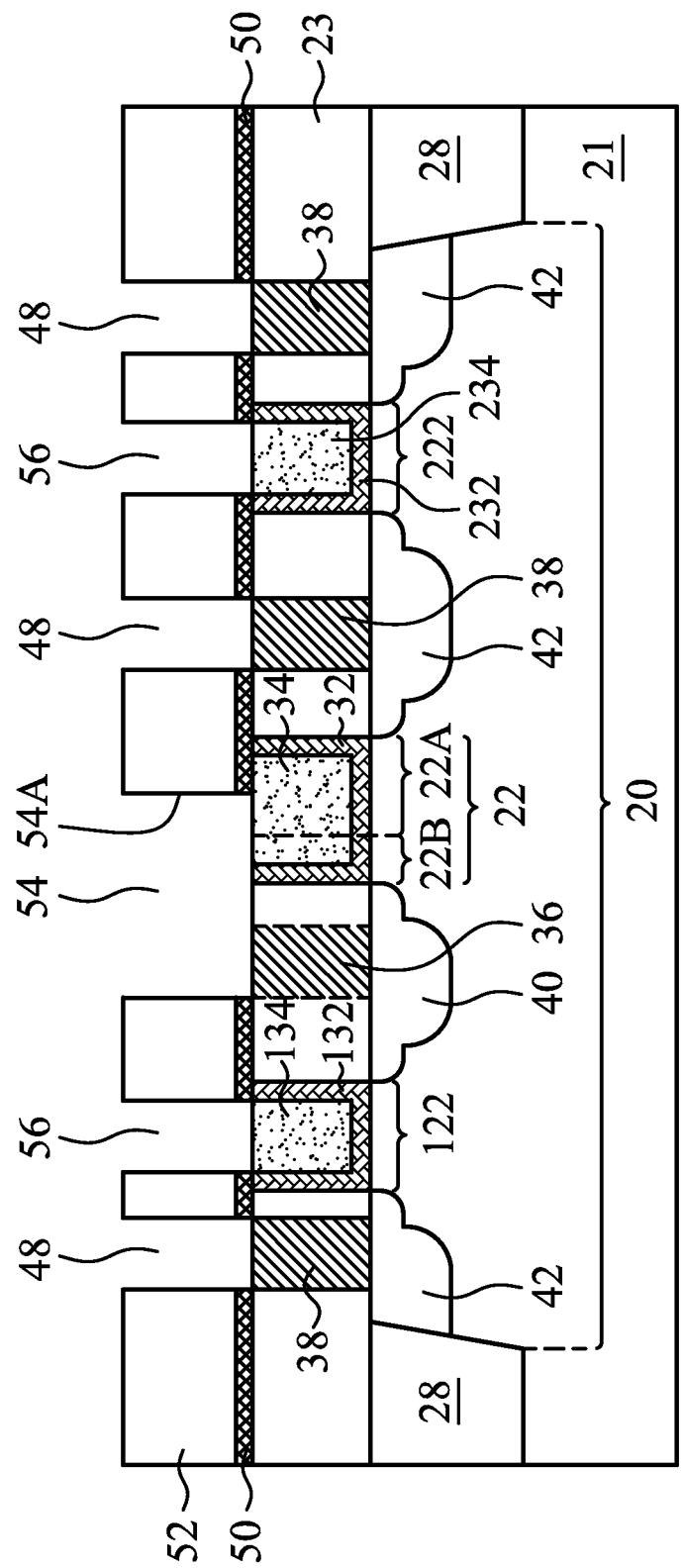
Figure 5A:
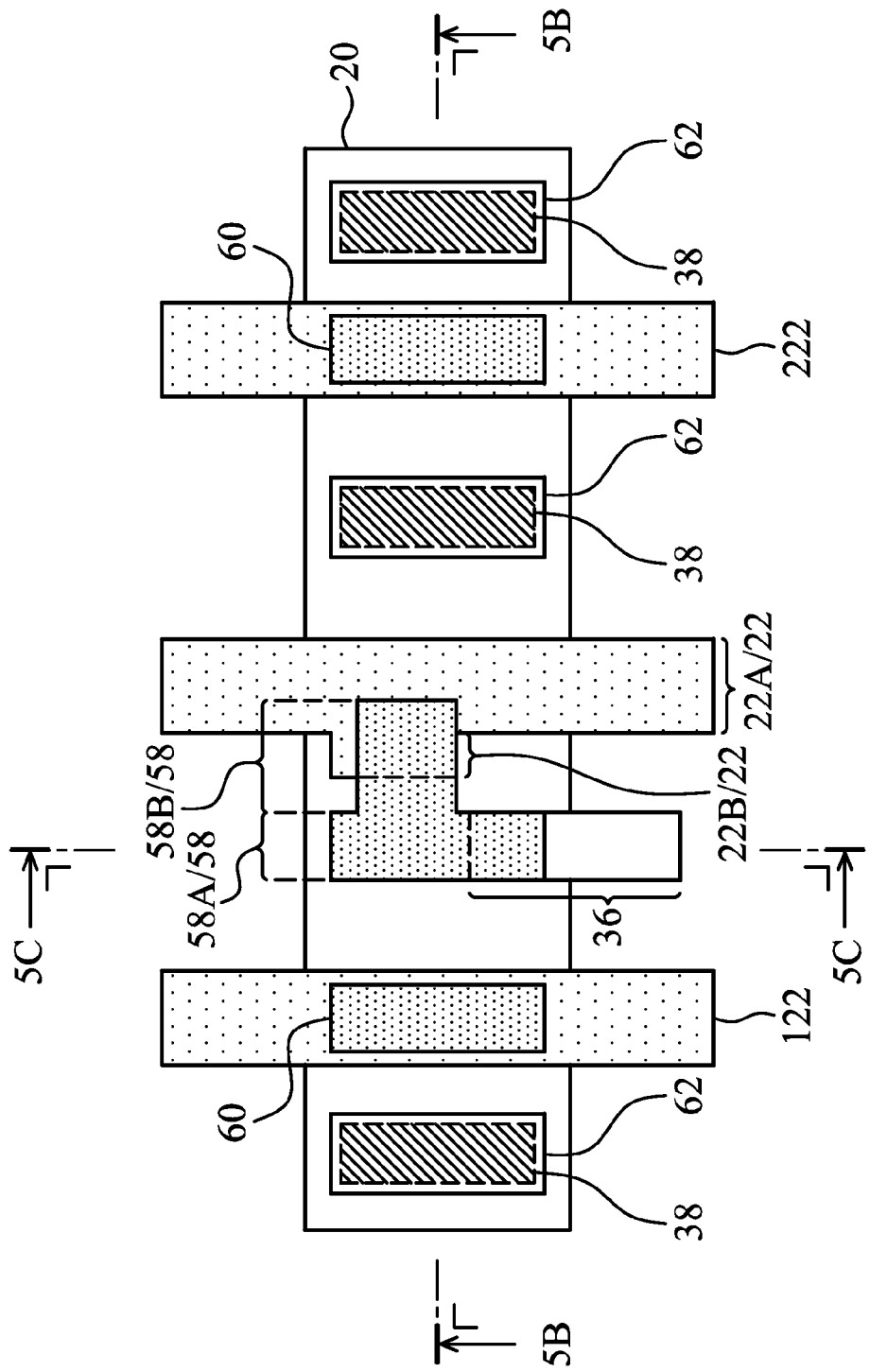

FIGS. 3A through 5C illustrate the formation of contact plugs 58, 60, and 62 (FIG. 5A). Referring to FIG. 3B, which is a cross-sectional view, Etch Stop Layer (ESL) 50 and ILD 52 are formed over ILD 23 and M0_OD1 36 and 38. Etch stop layer 50 may comprise silicon carbon, silicon nitride, silicon oxynitride, or the like. ILD 52 may be formed of a dielectric material selected from the same candidate materials for forming ILD 23. Contact plug openings 46 and 48 are formed in ESL 50 and ILD 52, so that M0_OD1s 36 and 38 are exposed. Contact plug openings 46 and 48 may be formed by etching ILD 52 using ESL 50 as an etch stop layer, and then etching ESL 50.

Figure 3A:
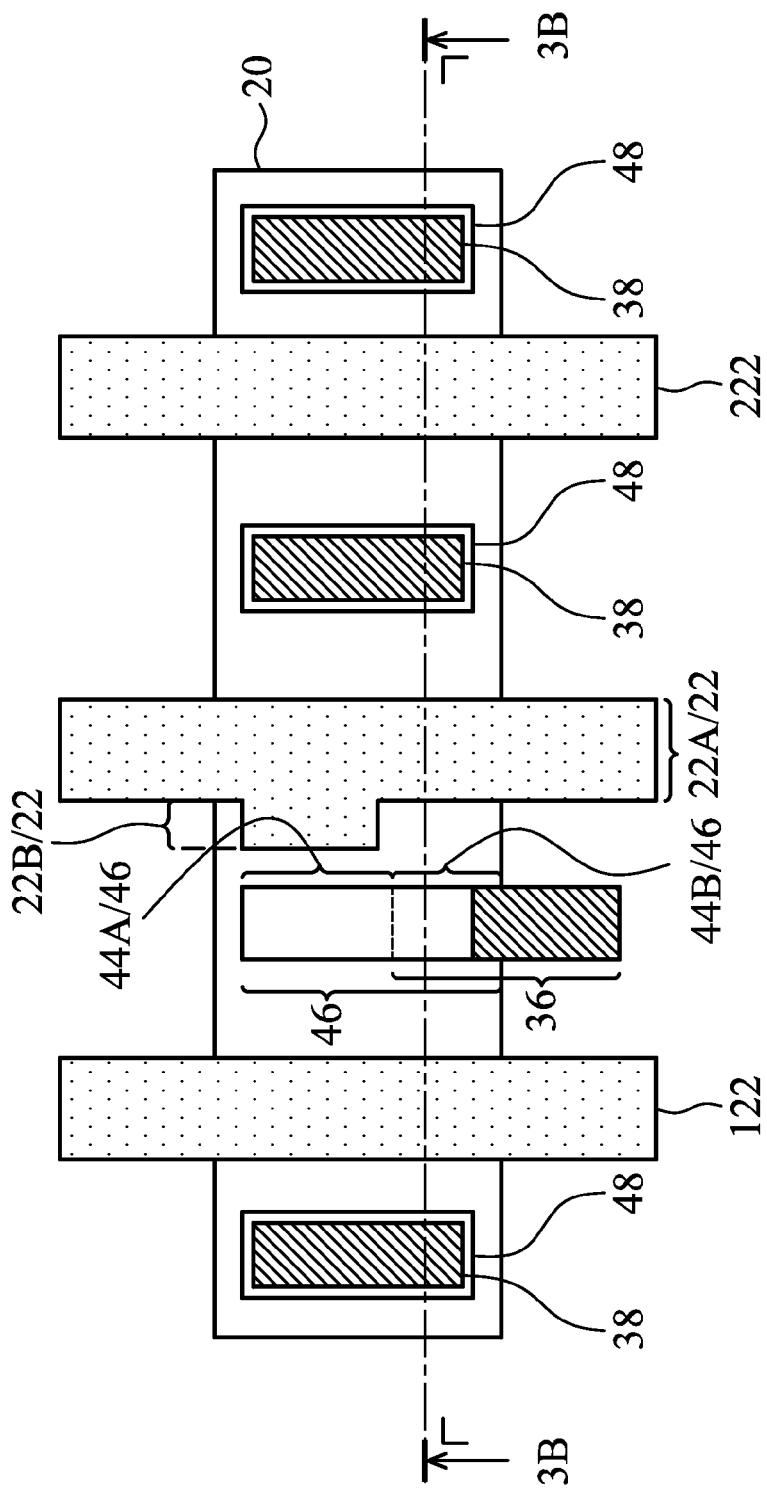
Figure 3B:
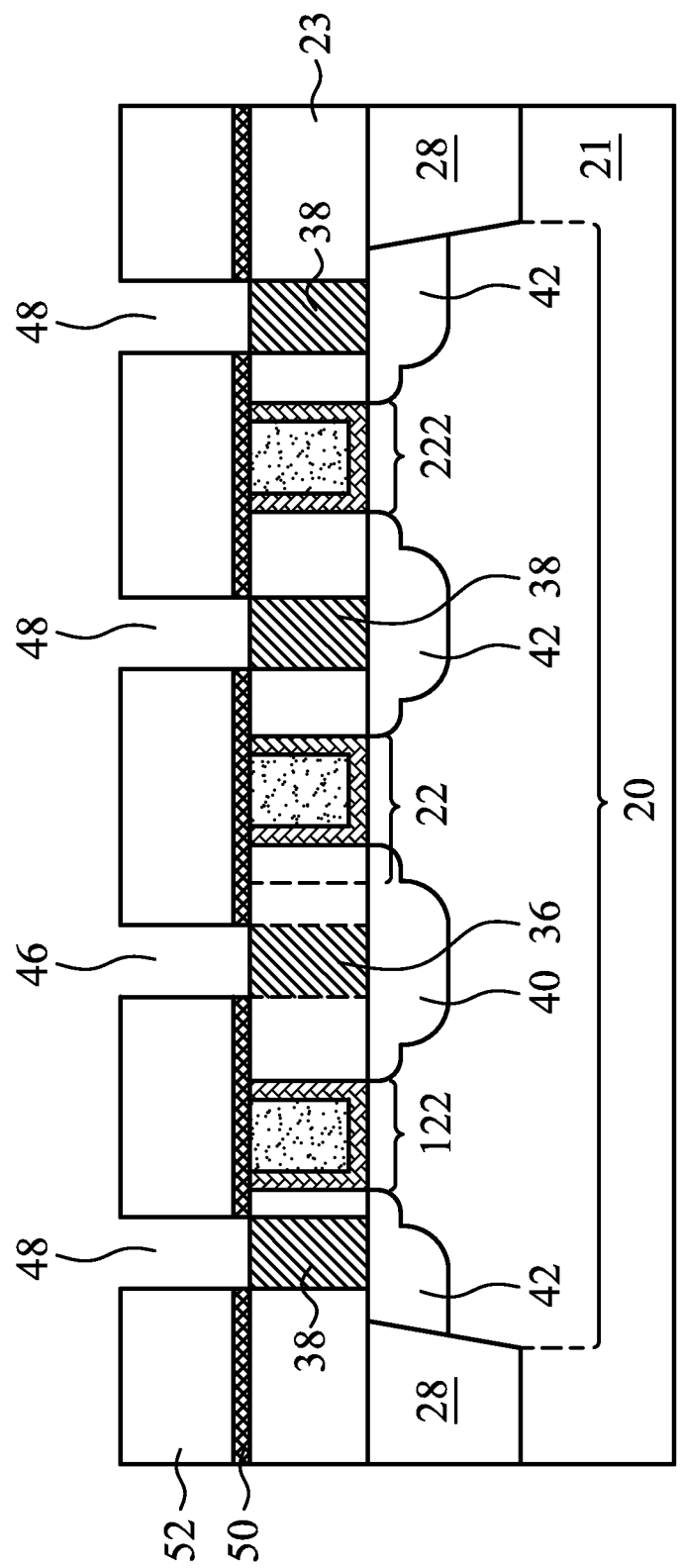

FIG. 3A illustrates a top view of the structure in FIG. 3B, wherein the cross-sectional view in FIG. 3B is obtained from the plane crossing line 3B-3B in FIG. 3A. In some embodiments, contact plug openings 48 are aligned to the corresponding underlying M0_OD1s 38. For clarity, contact plug openings 48 are shown as having top-view sizes slightly greater than the corresponding underlying M0_OD1s 38. Contact plug openings 48 may also have top-view sizes and top-view shapes equal to, or smaller than, that of M0_OD1s 38.

Contact plug opening 46 includes first portion 46A misaligned with M0_OD1 36, and second portion 46B aligned to a portion of M0_OD1 36. M0_OD1 36 is thus exposed through contact plug opening 46. Furthermore, a portion of contact plug opening 46 is aligned with a portion of jog 22B, which means that the portion of contact plug opening 46 and the portion of jog 22B have equal distances from edges 20A and 20B of active region 20.

FIG. 4A illustrates a top view showing the formation of openings 54 and 56, which are formed simultaneously in a same etching step. Openings 54 and 56 are also referred to as the M0_poly openings 54 and 56 since the contact plugs filled therein comprise portions directly over and connected to gate strips 22, 122, and 222 (which may comprise polysilicon in some embodiments, hence the name "poly"). Opening 54 comprises a portion overlap a portion of opening 46. As a result, opening 46 and 54 in combination form an integrated and continuous opening, which is referred to as opening 46/54 hereinafter. Opening 54 further overlaps jog 22B, and hence jog 22B is exposed through opening 54. Furthermore, gate strip portion 22A may, or may not, comprise a portion exposed through opening 54.

FIG. 4B illustrates a cross-sectional view of the structure in FIG. 4A, wherein the cross-sectional view is obtained from the plane crossing line 4B-4B in FIG. 4A. M0_OD1 36 is not in the illustrated plane, and hence is illustrated using dashed lines. To allow enough process window, edge 54A of opening 54 may be designed to align to a middle line of gate strip portion 22A, so that even if edge 54A shifts to the right due to process variation, edge 54A still overlaps gate strip portion 22A, and will not be shifted to the right of the right edge of gate strip portion 22A.

Next, referring to FIG. 5A, openings 54 and 56 (FIGS. 4A and 4B) are filled to form contact plugs 58 and 60, respectively. At the same time contact plugs 58 and 60 are formed, contact openings 48 (FIGS. 4A and 4B) are also filled to form contact plugs 62, which are also referred to as M0_OD2 hereinafter. The formation process may include filling openings 46, 48, 54, and 56 with a conductive adhesion/barrier layer (comprising titanium or tantalum, for example) and a metallic material such as tungsten or copper, and performing a CMP. Contact plug 58 is overlying, and electrically interconnects, M0_OD1 36 and gate electrode 34. Referring to FIG. 5A, contact plug 58 includes first portion 58A, which is spaced apart from gate strip 22, and second portion 58B connected to first portion 58A. Portions 58A and 58B may form an L-shape in some embodiments. The formation of jog 22B increases the landing area of contact plug 58. As a result, the process window for electrically connecting gate strip 22A and contact plug 36 is increased because contact plug 58 is allowed to move to the left and still lands on jog 22B. The contact resistance between contact plug 58 and gate strip 22A is reduced. Contact plugs 60 are formed over, and are connected to, the respective underlying gate electrodes 134 and 234, respectively.

Figure 5B:
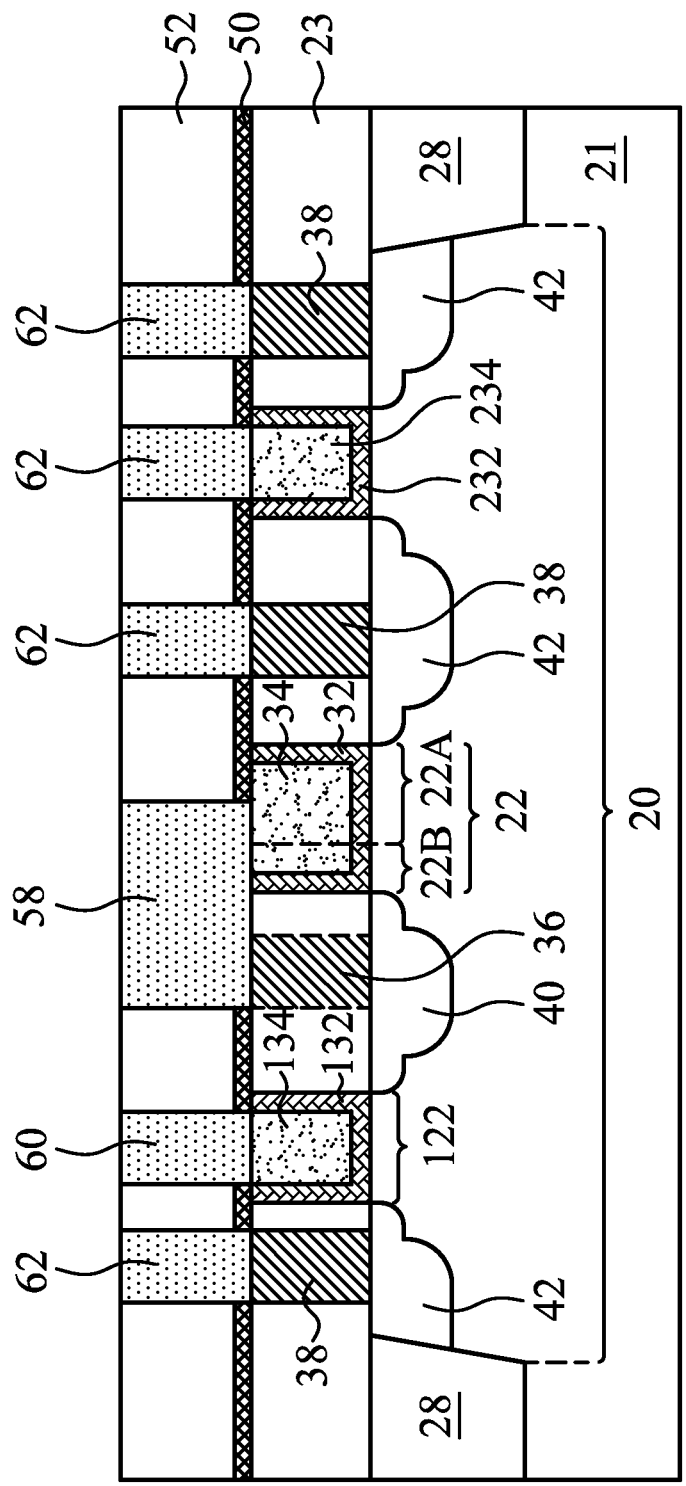

FIG. 5B illustrates a cross-sectional view of the structure in FIG. 5A, wherein the cross-sectional view is obtained from the plane crossing line 5B-5B in FIG. 5A. FIG. 5B illustrates that each of gate electrodes 34, 134, and 234 and M0_OD1 36 and 38 is electrically connected to the respective overlying contact plugs 58, 60, and 62.

Figure 5C:
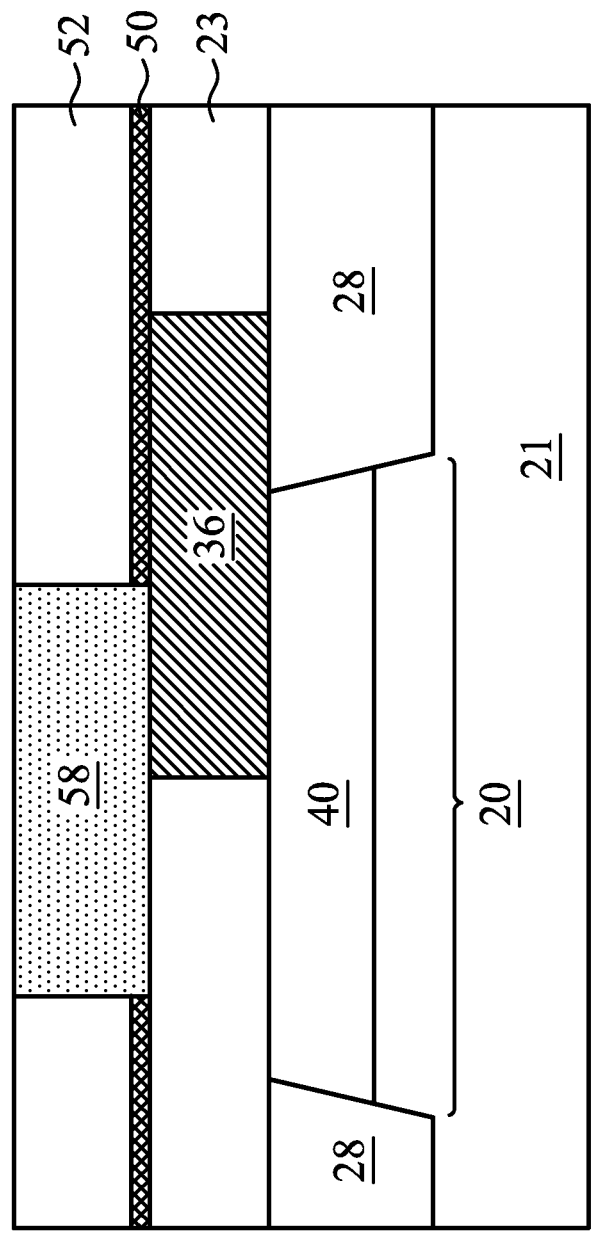

FIG. 5C illustrates a cross-sectional view of the structure in FIG. 5A, wherein the cross-sectional view is obtained from the plane crossing line 5C-5C in FIG. 5A. FIG. 5C shows that contact plug 58 includes a portion overlapping and contacting a portion of M0_OD1 36, and another portion overlapping and contacting ILD 23. Combining FIGS. 5B and 5C, it is observed that contact plug 58 has a bottom surface, which includes a first portion contacting a top surface of a portion of M0_OD1 36 (FIGS. 5B and 5C), a second portion over and contacting a top surface of ILD 23 (FIG. 5C), and a third portion over and contacting jog 22B and possibly gate strip portion 22A (FIG. 5B).

Figure 6:
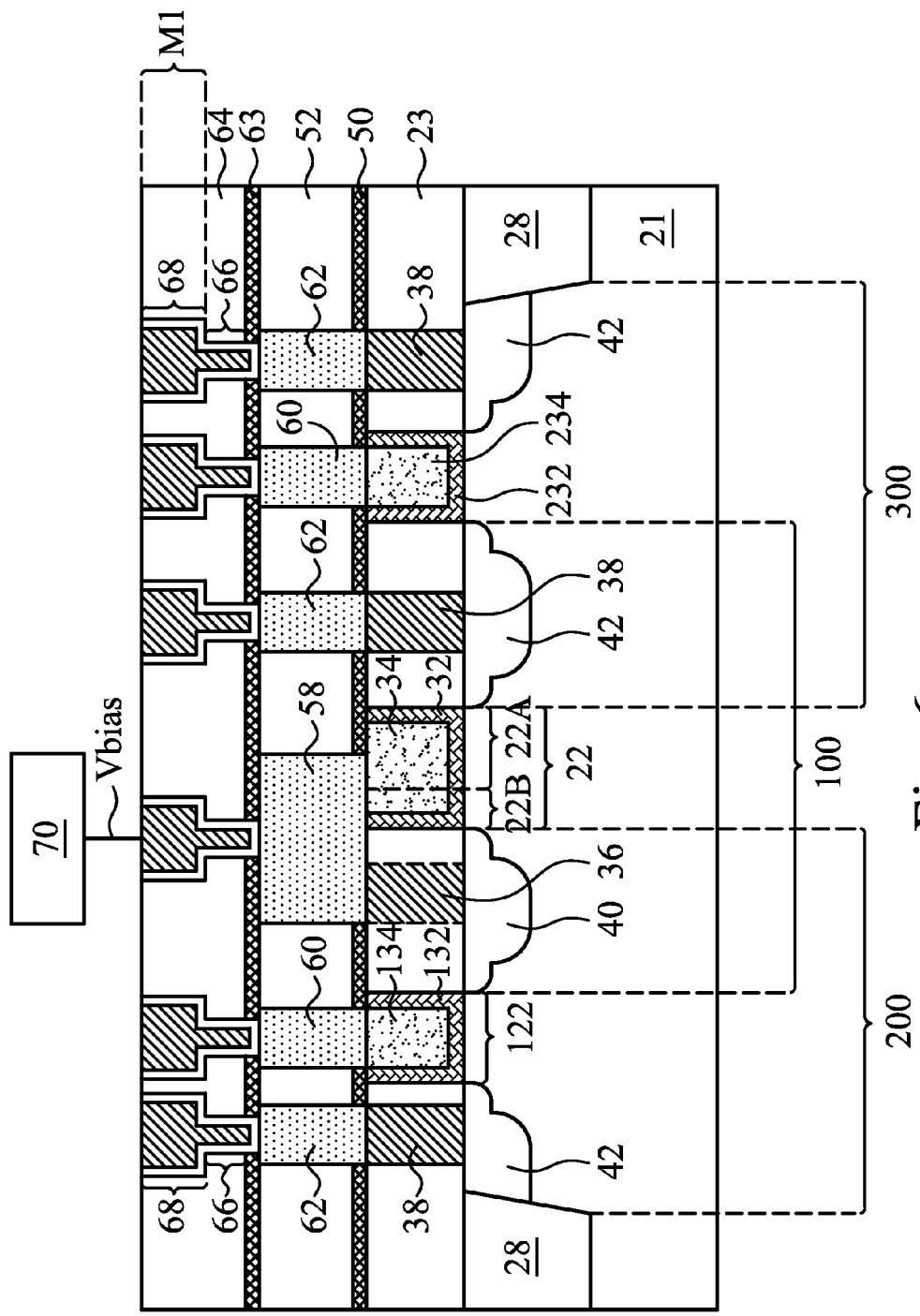

In subsequent processes, as shown in FIG. 6, ESL 63, M0 vias 66, and metal lines 68 are formed in bottom metal layer M1. M0 vias 66 and metal lines 68 are formed in dielectric layer 64, wherein dielectric layer 64 may be formed of a low-k dielectric material having a k value smaller than about 3.0, or smaller than about 2.5, for example. In some embodiments, M0 vias 66 and metal lines 68 are formed using a dual-damascene process, and hence no noticeable interfaces are formed between M0 vias 66 and the respective overlying metal lines 68. In alternative embodiments, M0 vias 66 are formed using a single-damascene process, and metal lines 68 may also be formed using a single-damascene process. In a subsequent process, more metal layers (not shown) may be formed over metal layer M1. M0 vias 66 and metal lines 68 may include a diffusion barrier layer and a copper-containing material over the diffusion barrier layer.

Gate strip 22, M0_OD1 36, and contact plug 58 may form an isolation structure by turning off the MOS transistor 100 that include gate electrode 34 as the gate. In these embodiments, voltage Vbias that is provided to gate electrode 34 may be connected to VSS, which may be the electrical ground when the respective transistor 100 is an NMOS transistor. Votlage Vbias may be provided by voltage source 70, which is configured to provide the constant voltage Vbias for turning off MOS transistor 100. In other embodiments, voltage Vbias may be a positive voltage lower than the threshold voltage of the MOS transistor. Alternatively, voltage Vbias that is provided to gate electrode 34 may be connected to VDD when the respective transistor is a PMOS transistor. On the other hand, gate electrodes 134 and 234 and source/drain regions 42 may form functional MOS transistors 200 and 300 that may be turned on and off depending on the voltage applied thereon. MOS transistor 100 thus acts as the isolation structure for MOS transistors 200 and 300.

In the embodiments, by forming jog 22B, the right edge of contact plug 58 may be designed to be shifted to the left (FIG. 6) without the concern that contact plug 58 will not be electrically connected to gate electrode 34. The process window is thus increased. Accordingly, with contact plug 58 already shifted to the left, even if process variation occurs, and contact plug 58 is undesirably shifted toward right, contact plug 58 will not be adversely shifted to the right of the right edge of gate strip 22A. This avoids the problem that when contact plug 58 is undesirably shifted to the right of the right edge of gate strip 22A, in the formation of the opening for filling contact plug 58, ILD 23 may be etched through, and contact plug 58 may be shorted to source/drain region 42 that is on the right side of gate electrode 34.

In accordance with embodiments, a device includes an active region in a semiconductor substrate, a gate strip over and crossing the active region, and a jog over the active region and connected to the gate strip to form a continuous region. The jog is on a side of the gate strip. A first contact plug is at a same level as the gate strip, wherein the first contact plug is on the side of the gate strip. A second contact plug is over the jog and the first contact plug. The second contact plug electrically interconnects the first contact plug and the jog.

In accordance with other embodiments, a device includes an active region in a semiconductor substrate. A first gate strip, a second gate strip, and a third gate strip are parallel to each other, and are over and crossing the active region, wherein the second gate strip is between the first gate strip and the second gate strip. A jog is over the active region and connected to the second gate strip. The jog is between the first gate strip and the second gate strip. The jog and the second gate strip in combination include a continuous gate electrode, and a continuous gate dielectric including a first portion overlapped by the continuous gate electrode and a second portion on a sidewall of the continuous gate electrode. A source/drain region is in the active region and between the first gate strip and the second gate strip. A first contact plug is at a same level as the gate strip, wherein the first contact plug is over and connected to the source/drain region. A second contact plug is over, and interconnecting, the first contact plug and the jog.

In accordance with yet other embodiments, a method includes forming a gate strip of a MOS device. The MOS device includes a strip portion and a jog over an active region. The strip portion and the jog in combination include a continuous gate electrode having a first portion in the strip portion and a second portion in the jog, and a continuous gate dielectric having a first portion in the strip portion and a second portion in the jog. The method further includes forming a first ILD, with the gate strip being in the first ILD, forming a first contact plug in the first ILD and connected to a source/drain region of the MOS device, forming a second ILD over the first ILD, and forming an opening in the second ILD. A portion of the first contact plug, a portion of the jog, and a portion of the first ILD between the jog and the first contact plug are exposed through the opening. The opening is filled to form a second contact plug.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
an active region in a semiconductor substrate, wherein the active region comprises a first edge and a second edge;
a gate strip over and crossing the active region, wherein the gate strip comprises a third edge and a fourth edge parallel to each other, with both the third edge and the fourth edge extending from the first edge to the second edge;
a jog overlapping the active region and connected to the gate strip to form a continuous region, wherein the jog is on a first side of the gate strip, wherein the jog comprises a fifth edge and a sixth edge parallel to the first edge, with the fifth edge overlapping the active region;
a first contact plug at a same level as the gate strip, wherein the first contact plug is on the first side of the gate strip; and
a second contact plug over the jog and the first contact plug, wherein the second contact plug electrically interconnects the first contact plug and the jog.

2. The device of claim 1 further comprising:
a first Inter-Layer Dielectric (ILD), wherein the gate strip and the jog are disposed in the first ILD;
an etch stop layer over the first ILD, the gate strip, and the first contact plug; and
a second ILD over the etch stop layer, wherein an upper portion of the second contact plug is disposed in the second ILD.

3. The device of claim 1, wherein the second contact plug comprises a bottom surface, and wherein the bottom surface comprises:
a first portion contacting a top surface of a portion of the first contact plug;
a second portion contacting a top surface of an inter-layer dielectric; and
a third portion contacting a top surface of the jog, wherein bottom surfaces of the first portion, the second portion, and the third portion are substantially coplanar.

4. The device of claim 1, wherein the second contact plug has an L-shape in a top view of the second contact plug and the semiconductor substrate, wherein the L-shape comprises a first leg and a second leg connected to the first leg, with the first leg contacting the first contact plug, and the second plug contacting the jog.

5. The device of claim 1, wherein an entirety of the jog overlaps the active region, and wherein the gate strip comprises:
a first portion overlapping the active region; and
second portions overlapping isolation regions on opposite sides of the active region.

6. The device of claim 1, wherein the jog and the gate strip in combination form:
a gate electrode comprising a first portion in the jog, and a second portion in the gate strip, wherein the first and the second portions are formed of a same material, with no interface therebetween; and
a gate dielectric comprising:
a bottom portion underlying the jog and the gate strip; and
sidewall portions on sidewalls of the gate electrode.

7. The device of claim 1, wherein the fifth edge is between, and is misaligned from, the first edge and the second edge.

8. The device of claim 1, wherein the sixth edge overlaps the active region, and the sixth edge is between the first and the second edge.

9. A device comprising:
an active region in a semiconductor substrate, wherein the active region comprises a first edge and a second edge opposite to each other;
a first gate strip, a second gate strip, and a third gate strip parallel to each other, and over and crossing the active region, wherein the second gate strip is between the first gate strip and the second gate strip, and the second gap strip overlaps the first edge and the second edge;
a jog over the active region and connected to the second gate strip, wherein the jog is between the first gate strip and the second gate strip, and wherein the jog and the second gate strip in combination comprise:
a continuous gate electrode; and
a continuous gate dielectric comprising a first portion overlapped by the continuous gate electrode and a second portion on a sidewall of the continuous gate electrode;
a source/drain region in the active region and between the first gate strip and the second gate strip;
a first contact plug at a same level as the first gate strip, wherein the first contact plug is over and connected to the source/drain region; and
a second contact plug over, and interconnecting, the first contact plug and the jog, wherein in a top view of the device, an entirety of the jog is closer to the first edge than an entirety of the first contact plug, and an entirety of portions of the first contact pug overlapping, the active region is closer to the second edge than an entirety of the jog.

10. The device of claim 9, wherein the second contact plug comprises a first portion overlapping a portion of the first contact plug, and a second portion misaligned with the first contact plug.

11. The device of claim 9 further comprising:
a first Inter-Layer Dielectric (ILD), wherein the first gate strip and the jog are disposed in the first ILD;
an etch stop layer over the first ILD, the first gate strip, and the first contact plug; and
a second ILD over the etch stop layer, wherein the second contact plug is disposed in the second ILD.

12. The device of claim 9, wherein the jog has a first width, the second gate strip has a second width, with the first width and the second width measured perpendicular to a longitudinal direction of the second gate strip, and wherein a ratio of the first width to the second width is greater than about 0.13.

13. The device of claim 9, wherein the second contact plug has an L-shape comprising a first leg and a second leg connected to the first leg, with the first leg contacting the first contact plug, and the second contact plug contacting the jog.

14. The device of claim 9, wherein an entirety of the jog overlaps the active region, and wherein the second gate strip comprises portions overlapping isolation regions on opposite sides of the active region.

15. A method comprising:
forming a gate strip of a MOS device, wherein the gate strip comprises a strip portion and a jog over an active region, with a first edge of the jog joining a second edge of the strip portion, wherein the strip portion and the jog in combination comprise:
a continuous gate electrode comprising a first portion in the strip portion and a second portion in the jog; and
a continuous gate dielectric comprising a first portion in the strip portion and a second portion in the jog, wherein the strip portion overlaps a third edge and a fourth edge of the active region, and the jog comprises a portion overlapping the active region, wherein the portion of the jog comprises a fifth edge and a sixth edge perpendicular to the third edge, with the fifth edge overlapping the active region and misaligned from the third edge and the fourth edge;
forming a first Inter-Layer Dielectric (ILD), with the gate strip being in the first ILD;
forming a first contact plug in the first ILD and connected to a source/drain region of the MOS device;
forming a second ILD over the first ILD;
forming an opening in the second ILD, wherein a portion of the first contact plug, a portion of the jog, and a portion of the first ILD between the jog and the first contact plug are exposed through the opening; and
filling the opening to form a second contact plug.

16. The method of claim 15, wherein the step of forming the opening comprises:
performing a first etch step on the second ILD to form a first opening in the second ILD, wherein the portion of the first contact plug is exposed through the first opening; and
performing a second etch step on the second ILD to expose the portion of the jog, wherein the portion of the jog is exposed through the second opening, and wherein the first opening and the second opening are connected to each other to form the opening.

17. The method of claim 15, wherein the strip portion and the jog are formed simultaneously in same process steps.

18. The method of claim 15 further comprising coupling the continuous gate electrode to a constant voltage to turn off the MOS device.

19. The method of claim 15, wherein the gate strip overlaps a first edge and a second edge of the active region, wherein the first and the second edges are opposite edges of the active region, and wherein in a top view of the MOS device, an entirety of the jog overlaps the active region.

* * * * *